United States Patent
Ainsworth

(10) Patent No.: US 10,608,589 B2
(45) Date of Patent: Mar. 31, 2020

(54) MULTIPLEXED INTEGRATING AMPLIFIER FOR LOSS OF SIGNAL DETECTION

(71) Applicant: Semtech Corporation, Camarillo, CA (US)

(72) Inventor: Christopher David Ainsworth, South Wales (GB)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 16/110,613

(22) Filed: Aug. 23, 2018

(65) Prior Publication Data

US 2020/0067455 A1 Feb. 27, 2020

(51) Int. Cl.
*H03F 3/08* (2006.01)
*H03F 1/02* (2006.01)
*H04B 10/079* (2013.01)

(52) U.S. Cl.
CPC .............. *H03F 1/0205* (2013.01); *H03F 3/08* (2013.01); *H04B 10/0797* (2013.01); *H03F 2200/129* (2013.01)

(58) Field of Classification Search
CPC combination set(s) only.
See application file for complete search history.

(56) References Cited

U.S. PATENT DOCUMENTS 5,703,511 A * 12/1997 Okamoto .............. H03L 7/0895
327/148
7,855,576 B1 * 12/2010 Luo .................... H04L 25/0276
326/33
2003/0094975 A1 * 5/2003 Noguchi ................ H03K 5/086
327/31
2003/0230733 A1 * 12/2003 Tanaka .................. H04N 5/3651
250/553
2004/0017224 A1 * 1/2004 Tumer .................... H03F 3/087
327/51
2004/0153681 A1 * 8/2004 Cao ...................... H03D 13/003
713/400

(Continued)

FOREIGN PATENT DOCUMENTS

DE 004139658 * 2/1991 ......... A61B 5/04282

OTHER PUBLICATIONS

Giammarco Rossi, Timothy E. Dimmick, and Daniel J. Blumenthal,Optical Performance Monitoring in Reconfigurable WDM Optical Networks Using Subcarrier Multiplexing,Journal of Lightwave Technology, vol. 18, No. 12, Dec. 2000, pp. 1641-1645.*

*Primary Examiner* — Omar S Ismail
(74) *Attorney, Agent, or Firm* — Brian M. Kaufman; Robert D. Atkins; Patent Law Group: Atkins and Associates, P.C.

(57) ABSTRACT

A loss of signal circuit has a multiplexer and a photodiode coupled to a first input of the multiplexer. A reference signal generator is coupled to a second input of the multiplexer. An amplifier is coupled to an output of the multiplexer. A demultiplexer includes an input of the demultiplexer coupled to an output of the amplifier. A first capacitor is coupled to a first output of the demultiplexer. A second capacitor is coupled to a second output of the demultiplexer. A comparator has a first input coupled to the first output of the demultiplexer and a second input of the comparator is coupled to the second output of the demultiplexer.

25 Claims, 8 Drawing Sheets

(56) References Cited

U.S. PATENT DOCUMENTS

| | | | |
|---|---|---|---|
| 2005/0059373 A1* | 3/2005 | Nakamura | H03F 1/30 455/255 |
| 2007/0075751 A1 | 4/2007 | Furuya et al. | |
| 2007/0182949 A1* | 8/2007 | Niclass | G01C 3/08 356/3 |
| 2011/0129224 A1* | 6/2011 | Umeda | H03F 3/08 398/58 |
| 2013/0314768 A1* | 11/2013 | Takeyama | H01S 3/30 359/334 |
| 2015/0229411 A1 | 8/2015 | Takeda | |
| 2015/0236652 A1* | 8/2015 | Yang | H03F 1/0205 330/251 |
| 2015/0318980 A1* | 11/2015 | Grollitsch | H03L 7/1806 375/376 |
| 2018/0269987 A1* | 9/2018 | Sun | H04B 10/11 |

\* cited by examiner

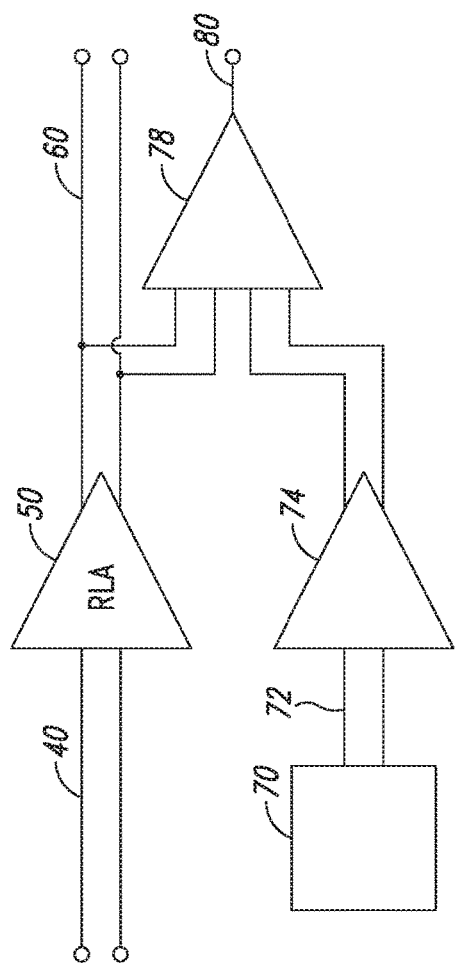
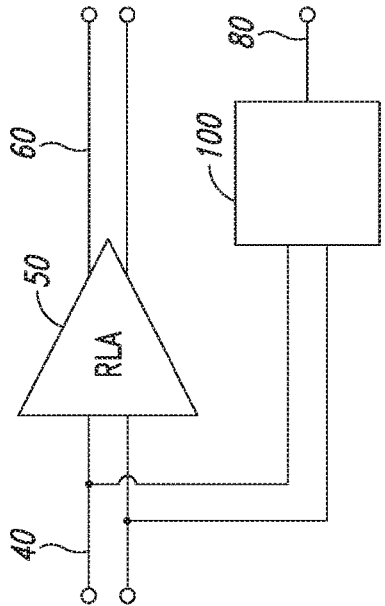
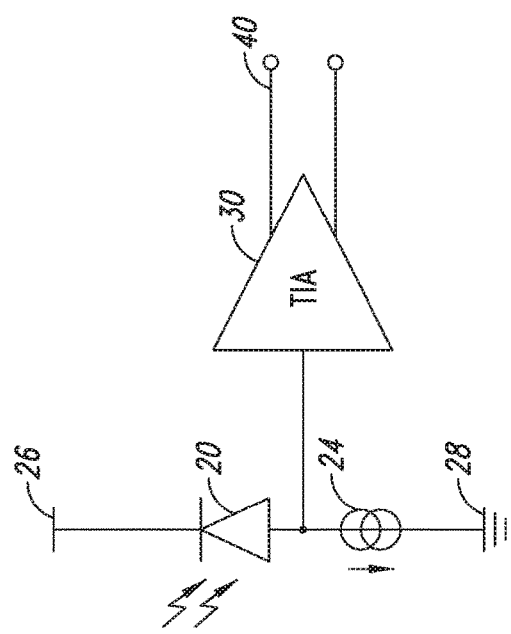
FIG. 1B
(Prior Art)
FIG. 2A
FIG. 1A
(Prior Art)

MULTIPLEXED INTEGRATING AMPLIFIER FOR LOSS OF SIGNAL DETECTION

FIELD OF THE INVENTION

The present invention relates in general to semiconductor devices and, more particularly, to loss of signal detection using a multiplexed integrating amplifier.

BACKGROUND OF THE INVENTION

Semiconductor devices are commonly found in modern electronic products. Semiconductor devices vary in the number and density of electrical components. Discrete semiconductor devices generally contain one type of electrical component, e.g., a light emitting diode (LED), photodiode, small signal transistor, resistor, capacitor, inductor, or power metal-oxide-semiconductor field-effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays.

Semiconductor devices are found in the fields of entertainment, communications, power conversion, networks, computers, and consumer products. Semiconductor devices are also found in military applications, aviation, automotive, industrial controllers, and office equipment.

Optical fibers are commonly used to transmit signals between semiconductor devices that are remote from each other. A light emitting diode (LED), laser diode, or another electronically controllable light source is used to generate a light wave into a fiber. The fiber guides the light wave from the source device to a destination device. The destination device includes a photodiode that converts the optical signal into an electrical signal for processing. Commonly an avalanche photodiode (APD) is used, and a transimpedance amplifier (TIA) amplifies the electrical signal for use by semiconductor devices.

FIG. 1a illustrates a simplified optical receiver circuit. A light signal is received from an optical fiber and directed at photodiode 20. Photodiode 20 is an APD in some embodiments. Photodiode 20 modulates current source 24 drawing current from voltage source 26 to ground node 28, and thus controls a input signal to trans-impedance amplifier (TIA) 30. TIA 30 outputs a differential pair signal as TIA output 40 that is coupled to a transceiver for further processing.

FIG. 1b illustrates a portion of a transceiver circuit for an optical system. TIA output 40 is coupled to an input of receiver limiting amplifier (RLA) 50. RLA 50 outputs a constant power output signal 60 to other transceiver logic that converts the signal to digital data. In order to determine when the input signal has been lost, the transceiver includes a loss of signal (LOS) circuit.

In the past, LOS circuits have been made up of a reference signal generator 70 that outputs a reference signal 72 to a LOS amplifier 74. Reference signal 72 is a signal similar to TIA output 40 at approximately the minimum magnitude level suitable for input to RLA 50. Reference signal 72 operates as a threshold, typically 5 millivolts (mV) peak-to-peak. LOS amplifier 74 is made as nearly identical to RLA 50 as reasonably possible. A comparator 78 is used to compare the output of RLA 50 and LOS amplifier 74. If the magnitude of data output signal 60 falls below the magnitude of the output from LOS amplifier 74, comparator 78 asserts LOS signal 80 to notify the system of a loss of signal.

RLA 50 in the main data path of optical receivers usually includes large amplifier stages and draws large electrical currents. Because RLA 50 is in the main data path, the data stream cannot be interrupted to check for loss of signal. Therefore, a second identical amplifier 74 is provided to do the LOS comparison. Having two identical amplifiers allows the reference to be compared against the received data without interrupting the main data path, but requires significant space on an optical receiver chip and increases overall current draw dramatically. Moreover, comparator 78 represents a significant load on RLA 50, thus reducing the performance of the RLA. Therefore, a need exists for a LOS circuit with a reduced circuit footprint and electrical current requirement.

BRIEF DESCRIPTION OF THE DRAWINGS

FIGS. 1a and 1b illustrate a fiber optic receiver with a prior art loss of signal detection circuit;

FIGS. 2a-2e illustrate a loss of signal circuit with a multiplexed integrating amplifier;

DETAILED DESCRIPTION OF THE DRAWINGS

Figure 2B:
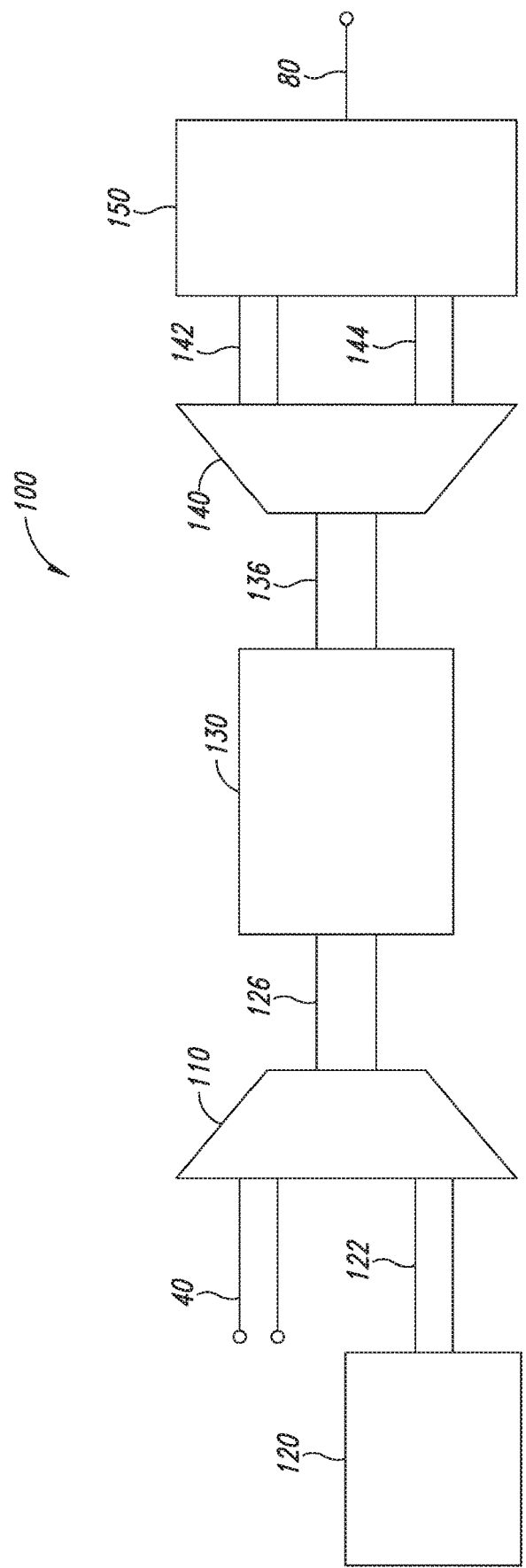

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

FIG. 2a illustrates an optical receiver circuit with a loss of signal (LOS) circuit 100. LOS circuit 100 has inputs coupled to the differential signal of TIA output 40 in parallel with RLA 50. Rather than having an amplifier identical to RLA 50 receiving a reference signal and comparing the output against RLA output signal 60, LOS circuit 100 generates LOS signal 80 independently of RLA 50. LOS circuit 100 includes a significantly smaller footprint than RLA 50, and draws significantly less current. Therefore, replacing LOS amplifier 74 in the prior art, which was reasonably identical to RLA 50, with LOS circuit 100 reduces the overall circuit size and current draw of the fiber optic transceiver.

Figure 2C:
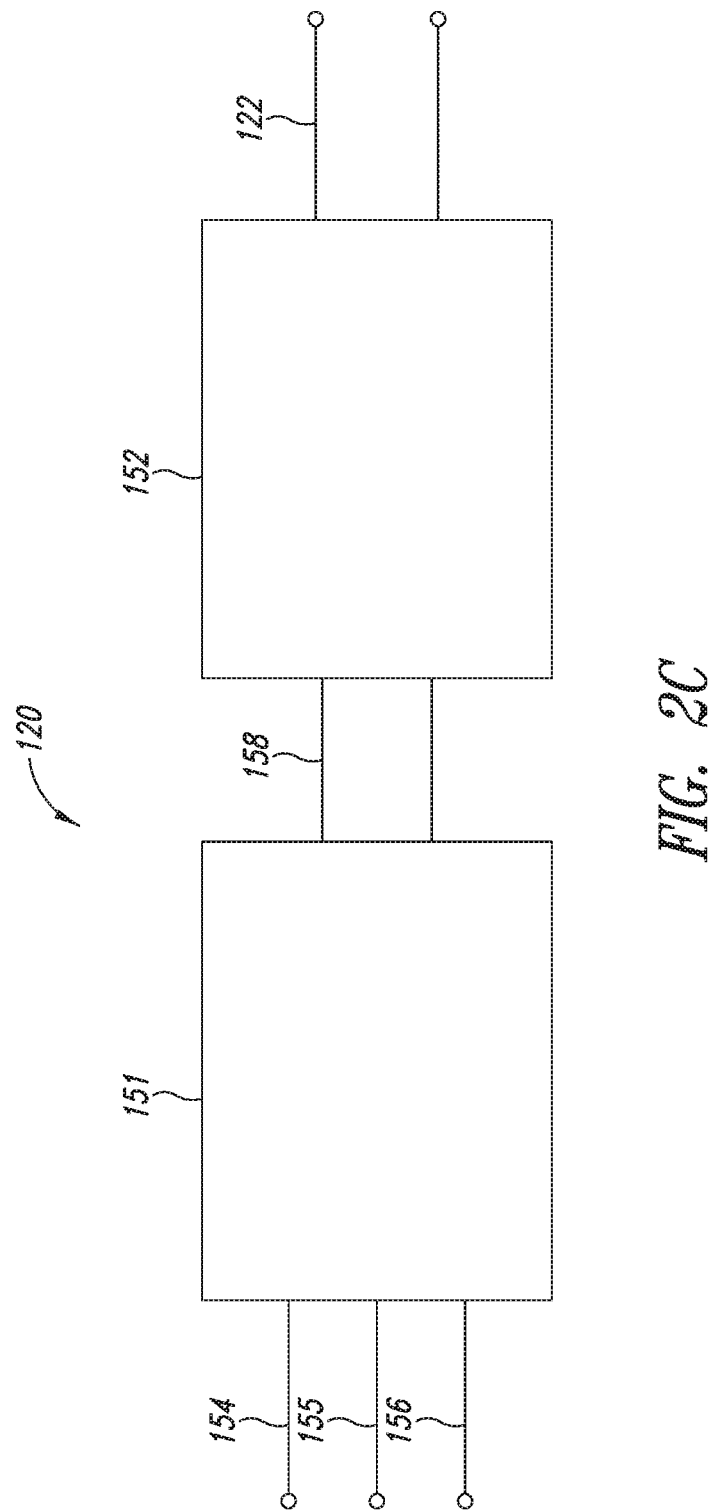

FIG. 2b is a block diagram of LOS circuit 100. TIA output 40 is routed to one input of multiplexer (MUX) 110. The second input to MUX 110 is coupled to reference signal generator 120. Reference signal generator 120 outputs a reference signal 122 that is at approximately the minimum magnitude of TIA output 40 that RLA 50 can accept. Therefore, if the magnitude of TIA output 40 falls below the magnitude of reference signal 122, LOS signal 80 should be asserted. Additional details of reference signal generator 120 are shown in FIG. 2c below.

MUX 110 alternates between outputting TIA output 40 and reference signal 122 as MUX output 126 to LOS amp block 130. When MUX 110 switches which signal is output, MUX 110 optionally shorts MUX output 126 to 0 mV temporarily to allow for zeroing of LOS amp block 130. LOS amp block 130 has an amplifier that increases the magnitude of MUX output 126 to a more useful magnitude for comparison. The amplifier in LOS amp block 130 has a smaller footprint and electrical current requirement than LOS amp 74 in the prior art because the comparison is not being done against the output of RLA 50. LOS amp block 130 rectifies the amplified signal and outputs a combination direct current (DC) signal 136 having a voltage potential proportional to a magnitude of the signal received from MUX output 126. Combination DC signal 136 is referred to as a combo DC signal because the same electrical conductors will either have a signal from the data path or the reference path depending on the state of MUX 110. LOS amp block 130 is shown in more detail in FIG. 2d, with additional features shown in FIGS. 3 and 4, below.

Combo DC signal 136 is routed to demultiplexer (demux) 140. Demux 140 splits combo DC signal 136 to either be output as data DC signal 142 or reference DC signal 144, depending on whether MUX 110 has coupled TIA output 40 or reference signal 122 to LOS amp block 130. If the input of LOS amp block 130 is coupled to TIA output 40 through MUX 110, then demux 140 couples combo DC signal 136 to data DC signal 142 and presents a high impedance to reference DC signal 144. If the input of LOS amp block 130 is coupled to reference signal 122 through MUX 110, then demux 140 couples combo DC signal 136 to reference DC signal 144 and presents a high impedance to data DC signal 142. There is also a brief time period when MUX 110 switches which input is coupled to MUX output 126 that is used for auto-zeroing of LOS amp block 130. During the auto-zeroing time period, both outputs of demux 140 are in high impedance.

Comparator block 150 receives data DC signal 142 and reference DC signal 144, and makes the comparison to determine whether loss of signal has occurred. Comparator block 150 includes a pair of integrating capacitors coupled to data DC signal 142 and reference DC signal 144, respectively. A data integrating capacitor in comparator block 150 is charged to the voltage potential of combo DC signal 136 when demux 140 couples combo DC signal 136 to data DC signal 142. When demux 140 has the output to data DC signal 142 at high impedance, the data integrating capacitor in comparator block 150 holds the voltage level. Similarly, a reference integrating capacitor in comparator block 150 is charged to the voltage of combo DC signal 136 when demux 140 couples the combo DC signal to reference DC signal 144, and otherwise holds the voltage level during high impedance.

Figure 2D:
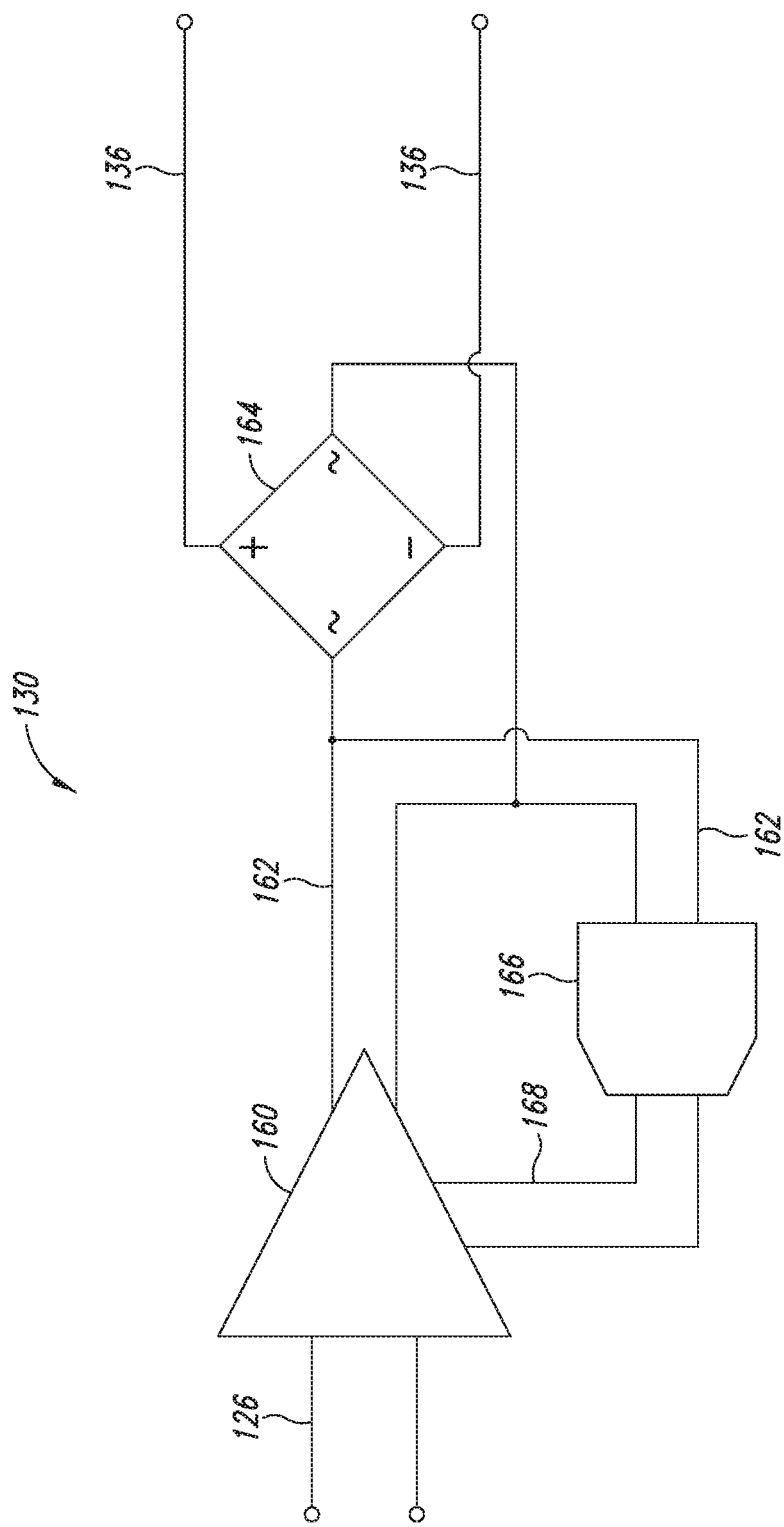
Figure 2E:
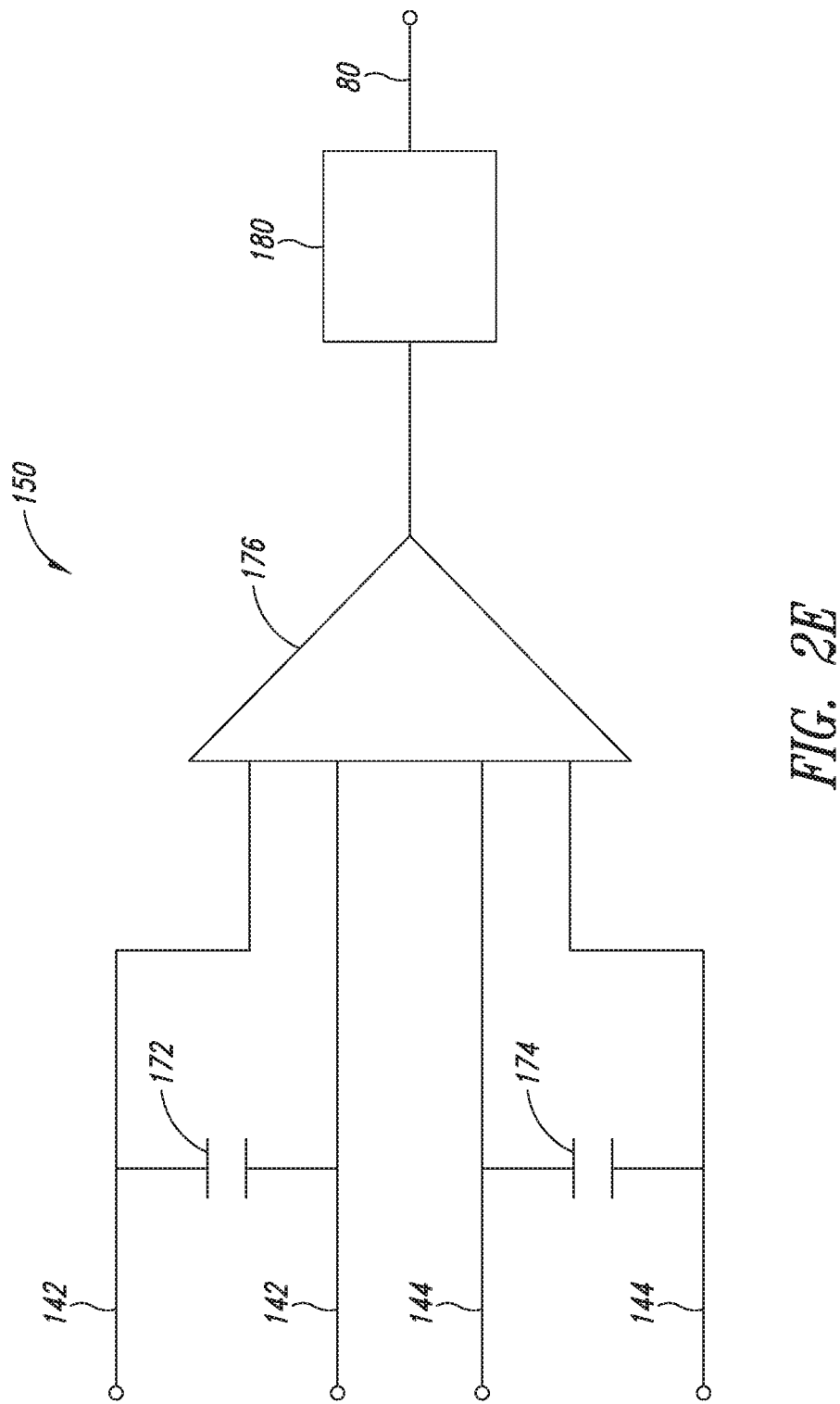

A comparator in comparator block 150 determines if the voltage potential difference between the two conductors of data DC signal 142 is above or below the voltage potential between the two conductors of reference DC signal 144 by comparing the voltage potential of the two capacitors. If the voltage potential received on data DC signal 142 is less than what is received on reference DC signal 144, than the magnitude of TIA output 40 has fallen below the magnitude of reference signal 122. LOS signal 80 is asserted by comparator block 150, and the incoming optical signal should be considered lost by the device. Additional detail of comparator block 150 is illustrated in FIG. 2e, with additional features shown in FIG. 4.

LOS circuit 100 is able to determine loss of signal using only a single LOS amp that is significantly smaller than the amp required in the prior art identical to RLA 50. LOS circuit 100 time-multiplexes the use of LOS amp block 130 between being used for the data signal of TIA output 40 and reference signal 122. The data signal to LOS amp block 130 is able to be interrupted because LOS circuit 100 is coupled in parallel to the main data path of RLA 50, rather than using the output of RLA 50 in the LOS comparison. Data to RLA 50 is not interruptible because the data received during the interruption would be lost. However, the data signal to LOS circuit 100 is only used for the LOS comparison, and not required for proper reception of optical data.

The data signal of TIA output 40 and reference signal 122 are time-multiplexed into LOS amp block 130 and then demultiplexed at the output of the LOS amp block to make the comparison. The multiplexed integrating amplifier for LOS detection (MIALOS) system provides for an optical transceiver with a significantly reduced size and power draw. Performance of the main data RLA 50 is improved by removing the comparator 78 as a load on the RLA. Having a single amplifier path for LOS detection allows much smaller amplifier stages to be used because jitter is less of a concern. The single amplifier path also means that both the data and reference signal receive the same amplification amount over changes in temperature, process, and supply voltage, thus increasing accuracy of the LOS comparison. Moreover, any DC offset coming out of LOS amp block 130 is the same for both data and reference paths, and therefore cancels out when the DC difference comparison is made in comparator block 150. Any noise picked up by LOS amp block 130 is also likely to be common for both data and reference signals, which will then be cancelled out in the DC comparison.

One aspect of optical transceivers in the prior art that made the multiplexed LOS amplifier topology difficult to implement is that the transmission gates usually used for optical transceivers are not sufficiently fast to multiplex the received signal. Typically Bi-CMOS technology is used to manufacture transceivers with BJTs relied on for RF amplification and CMOS used for control logic. Because the RF signals are not switched with the CMOS control logic, a slower CMOS technology is used to save money. The CMOS part of the Bi-CMOS process used in the prior art is too slow to properly implement LOS circuit 100. LOS circuit 100 uses CMOS transmission gates that are accurate at the full switching frequency of the data signal, e.g., 5 GHz for a 10 gigabit data connection.

One advantage of the multiplexed topology having LOS circuit 100 independent of RLA 50 is that the RLA can be shut down to save power while control logic can still monitor the signal for assertion or de-assertion of LOS signal 80. In the prior art, there is nothing to compare the reference signal against if RLA 50 is shut down. LOS circuit 100 can also be shut down while still receiving data via RLA 50.

FIG. 2c illustrates additional detail of reference signal generator 120. Signal generator 120 has a LOS reference voltage generator 151 and a LOS reference modulator 152. Voltage generator 151 is controlled by LOS level input 154, LOS hysteresis input 155, and LOS status input 156. Voltage generator 151 includes a digital-to-analog converter (DAC) and a buffer driver to output a DC voltage 158 to modulator 152 based on the signals received at inputs 154-156. DC voltage 158 is a voltage configured by inputs 154-156 to approximately equal the minimum acceptable peak-to-peak voltage swing for TIA output 40. DC voltage 158 includes two conductors with two different voltage levels referenced to the common mode voltage.

The value of DC voltage 158 is controlled by inputs 154-156. Inputs 154-156 are wired to hardware registers within the transceiver controlled by a processor internal or external to the transceiver in one embodiment. LOS level input 154 sets a default DC voltage value for DC voltage 158. In one embodiment, LOS level input 154 is an eight bit input to voltage generator 151 that sets DC voltage 158 to a value between 0 mV and 127 mV, with the binary value of input 154 setting the DC voltage value in 0.5 mV increments. Not all values of LOS level input 154 may be recommended, e.g., LOS accuracy may only be guaranteed over the range between 10 mV and 100 mV in some embodiments.

LOS hysteresis input 155 controls an amount of hysteresis to apply when a signal is lost. In one embodiment, LOS hysteresis input 155 is a three bit value that sets a decibel (dB) value for hysteresis. In one embodiment, each binary digit increment of LOS hysteresis input 155 increases the hysteresis of voltage generator 151 by 0.5 dB, e.g., 0b000 disables hysteresis, 0b001 provides 0.5 dB of hysteresis, and 0b111 provides 3.5 dB of hysteresis. In other embodiments, the translation between a binary value of LOS hysteresis input 155 and an actual hysteresis value can use any suitable encoding.

LOS status input 156 is asserted when LOS circuit 100 asserts LOS signal 80. LOS status input 156 can be directly coupled to LOS signal 80, or there may be intervening logic. LOS status input 156 tells voltage generator 151 when signal loss was detected, and therefore when to apply hysteresis. When LOS status input 156 is asserted, DC voltage 158 is increased by a gain factor set by LOS hysteresis input 155, e.g., a 1.0 dB hysteresis setting of the hysteresis input would increase DC voltage 158 from 50 mV to approximately 56.1 mV. The 1.0 dB hysteresis setting for a 50 mV threshold level would mean that, if TIA output 40 falls under 50 mV, i.e., under the LOS threshold, the optical signal would be considered lost until TIA output 40 went up to at least 56.1 mV. Hysteresis reduces the likelihood that LOS signal 80 rapidly switches between being asserted and deasserted.

In addition to inputs 154-156, there can also be an input to, or a programmable register within, voltage generator 151 to set a temperature slope for DC voltage 158. Voltage generator 151 can be programmed to match a falling gain of TIA 30 as temperature increases. In one embodiment, there are eight separate slopes between 0 dB/° C. and 0.028 dB/° C. corresponding to codes 0x00 to 0x07 in the register. The programmable temperature slope correction block in voltage generator 151 applies a bias current to the voltage generator so that the DC voltage 158 tracks variations in TIA output 40 to give an accurate optical signal level threshold. The temperature can be detected by a temperature detection circuit in voltage generator 151 or on TIA 30. The temperature detection circuit can be a thermistor with a resistance that varies with temperature, a capacitor with a value dependent on temperature, or any other suitable device.

LOS modulator 152 receives DC voltage signal 158 from voltage generator 151 and chops the voltage at a suitable frequency to generate reference signal 122. LOS modulator 152 includes a switch that alternates between outputting the voltage potential of DC voltage 158 to reference signal 122, or outputting 0 V to the reference signal output. Thus, reference signal 122 becomes an AC signal with a peak-to-peak magnitude approximately equal to the voltage potential of DC voltage 158. In one embodiment, LOS modulator 152 chops DC voltage 158 at 10 megahertz (MHz) to generate reference signal 122.

Reference signal 122 is coupled to MUX 110 along with TIA output 40, and MUX 110 couples one of the two signals to LOS amp block 130 via MUX output 126. FIG. 2d illustrates details of LOS amp block 130. MUX output 126 is coupled as an input to LOS amplifier 160. LOS amplifier 160 is a high speed linear amplifier in one embodiment. LOS amplifier 160 outputs an amplified version of MUX output 126 as LOS amplifier output 162.

LOS amplifier output 162 is an alternating current (AC) signal that is substantially identical to either TIA output 40 or reference signal 122, depending on which signal MUX 110 is outputting. The AC signal of LOS amplifier output 162 is coupled to a radio frequency (RF) rectifier 164. Rectifier 164 includes diodes configured in a full-wave bridge rectifier to generate combo DC signal 136. Other rectifier topologies are used in other embodiments. Combo DC signal 136 includes a voltage potential across the two conductors that is approximately equal to the magnitude of LOS amplifier output 162. The capacitors in comparator block 150 hold the voltage potential of combo DC signal 136 near the peak voltage of the AC signal. Without a significant load on combo DC signal 136, ripple is kept relatively low.

LOS amplifier output 162 is also coupled to auto-zero amplifier block 166. Auto-zero amplifier block 166 includes a differential operational transconductance amplifier (OTA). The OTA in auto-zero amplifier block 166 amplifies the DC offset from LOS amplifier 160 and outputs a biasing DC current 168 to the LOS amplifier. Biasing current 168 is fed into a sample and hold correcting circuit to correct a DC offset of LOS amplifier 160. The zeroing offset value is stored as charge on a capacitor in auto-zero amplifier block 166. The capacitor is significantly smaller than what is required with DC restore circuits in the prior art topology.

In some embodiments, auto-zeroing occurs when MUX 110 switches which signal is being amplified. There is a brief time period when the signals are switched in which the inputs of amplifier 160 are shorted to zero millivolts by MUX 110. Auto-zero amplifier 166 changes biasing current 168 to make the output of amplifier 160 zero during the auto-zero period. Biasing current 168 is then held constant while amplifier 160 amplifies TIA output 40 or reference signal 122, and auto-zeroing occurs again when MUX 110 swaps the input signal to amplifier block 130. In other embodiments, auto-zero amplifier block 166 can update the auto-zero biasing current 168 less often, or can constantly update the biasing current even when amplifier 160 is active. The input of auto-zero amplifier 166 is provided from combo DC signal 136 rather than the AC signal of LOS amplifier output 162 in other embodiments.

Combo DC signal 136 is a voltage potential that represents the magnitude of whichever signal is currently being input to LOS amplifier block 130, either reference signal 122 or TIA output 40. Combo DC signal 136 is passed to demux 140 and split out to two different inputs of comparator block 150 based on which signal was input to amplifier block 130. If TIA output 40 was amplified by block 130, then demux 140 couples combo DC signal 136 to data DC signal 142, and reference DC signal 144 is a high impedance output from the demux. If reference signal 122 was amplified by block 130, then demux 140 couples combo DC signal 136 to reference DC signal 144, and data DC signal 142 is a high impedance output from the demux. High impedance means that demux 140 appears similar to an open circuit connection for the particular output, and does not draw significant electrical current from, or output significant electrical current to, the high impedance output. Being in high impedance allows the respective capacitor in comparator block 150 to hold a charge and maintain a relatively constant voltage potential when the other demux 140 output is selected.

FIG. 2e illustrates details of comparator block 150 receiving data DC signal 142 and reference DC signal 144 from demux 140. Comparator block 150 has two integrating capacitors. Data integrating capacitor 172 receives a voltage potential from data DC signal 142 and is charged to a voltage potential proportional to the peak-to-peak magnitude of TIA output 40. Data integrating capacitor 172 then holds the voltage potential approximately the same while amplifier block 130 switches to amplifying reference signal 122. When reference signal 122 is being amplified, demux 140 couples combo DC signal 136 to reference DC signal 144 and charges reference integrating capacitor 174 to a voltage potential proportional to reference signal 122.

Demux 140 alternatively causes capacitor 172 and capacitor 174 to be updated, while the other capacitor maintains its voltage potential. Comparator 176 receives the voltage potentials of data DC signal 142 and reference DC signal 144, and outputs a signal indicating which of the two inputs is higher. In one embodiment, comparator 176 is implemented using an operational amplifier capable of comparing two differential inputs. Comparator 176 outputs a logic one when data DC signal 142 falls below reference DC signal 144 to indicate loss of signal. The output of comparator 176 can be active-low or active high. In some embodiments, comparator block 150 includes an RC filter between the integrating capacitors 172-174 and the inputs of comparator 176 to reduce the effect of noise from comparator 176 affecting the DC signals 142 and 144.

The output of comparator 176 is optionally routed through a glitch filter 180 to generate LOS signal 80. Glitch filter 180 is a delay filter that requires the output from comparator 176 to be asserted for a threshold amount of time before LOS signal 80 will be asserted. In one embodiment, glitch filter includes a 2.5 microsecond (μs) delay. The delay can be configured by a resistor-capacitor (RC) filter slowing the rise time of the signal out of comparator 176 to a buffer in glitch filter 180. Glitch filter 180 reduces the likelihood that LOS signal 80 will be asserted by very short glitches in the input optical signal, which are normal and do not necessarily result in a loss of data.

Figure 3:
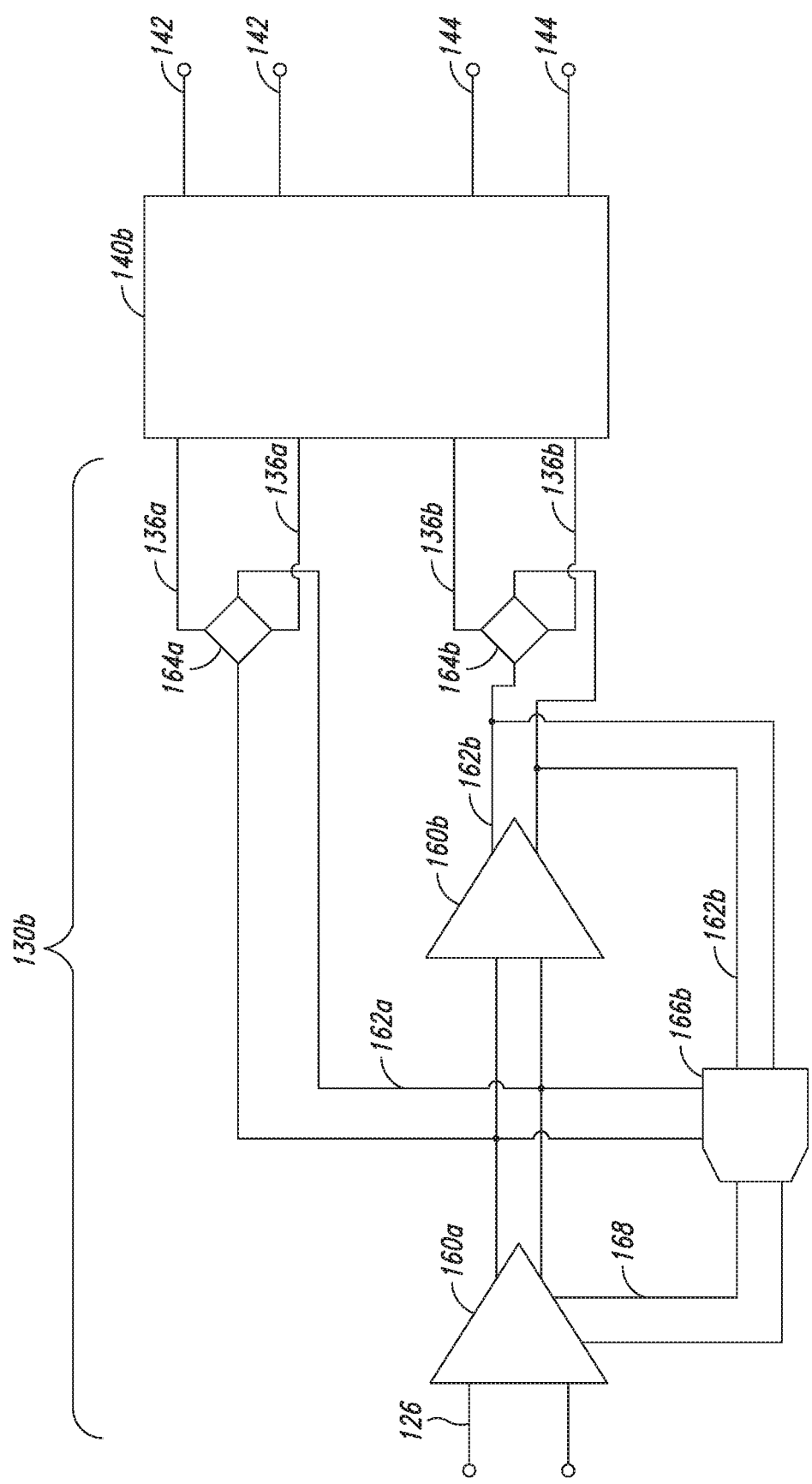
FIG. 3 illustrates a multi-stage amplifier for the multiplexed loss of signal circuit.

FIG. 3 illustrates an embodiment of LOS amp block 130, as LOS amp block 130b, with two amplifier stages 160a and 160b. The first amplifier 160a receives MUX output 126 and applies an amplification to create a first stage amplified signal 162a. The output of amplifier 160a is rectified by rectifier 164a and provided as first stage DC signal 136a to switch 140b. First stage amplified signal 162a is also coupled as an input to second stage amplifier 160b. Second stage amplifier 160b applies a second amplification factor on top of what was already done by first stage amplifier 160a. The output of second stage amplifier 160b is rectified by rectifier 164b and coupled as second stage amplified signal 162b to switch 140b.

Switch 140b operates similarly to demux 140 in the previous embodiment. However, in addition to demultiplexing the inputs to either data DC signal 142 or reference DC signal 144, switch 140b also includes a switch to select either the output of first stage amp 160a or the output of second stage amp 160b. Having a two-stage amp allows LOS circuit 100 to apply a different amount of amplification depending on the magnitude of the input signal.

Smaller input signals typically require a larger amplification to ensure that the comparison to the reference is accurate. In one embodiment, both amplification stages are used if the magnitude of reference signal 122 is less than or equal to 20 mV. Otherwise, only the first amplification stage is used. To use both amplification stages, switch 140 connects second stage DC signal 136b to the appropriate DC signal 142 or 144. To use only the first amplification stage, switch 140 connects first stage DC signal 136a to the appropriate output. To save power, LOS circuit 100 can be configured to power down second stage amplifier 160b when only the first stage is used.

Auto-zero amp 166b has both first stage amplified signal 162a and second stage amplified signal 162b as inputs. Auto-zero amp 166b zeroes based on the proper input depending on which output is being used by switch 140b. Therefore, the output being used is the same one that is being zeroed.

Figure 4:
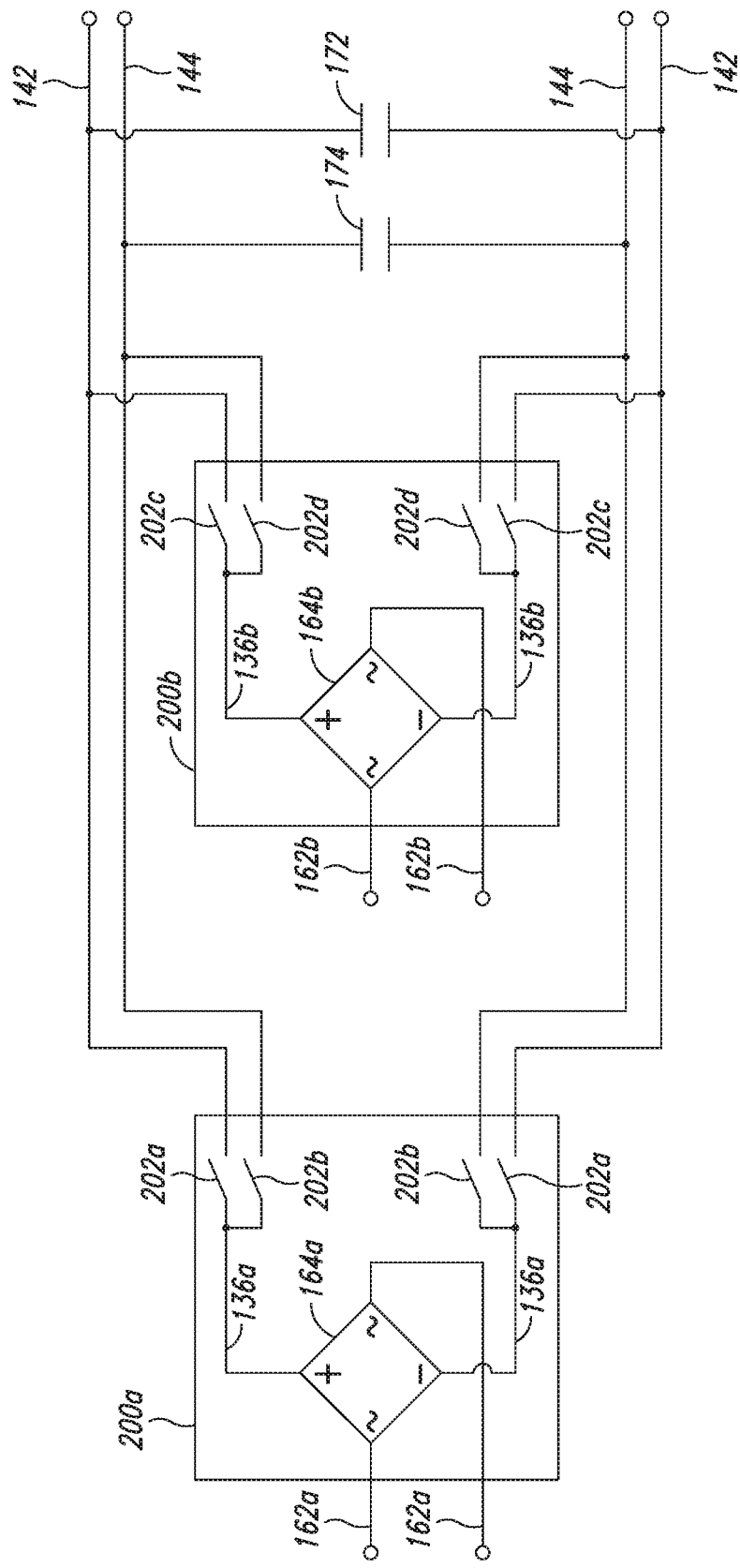
FIG. 4 illustrates a multi-stage amplifier with switches built in to the rectifiers for demultiplexing and switching the signal outputs.

FIG. 4 illustrates switched RF rectifiers usable with the two amplifier stages in FIG. 3. Each rectifier block 200 includes switches 202 that operate to switch and demultiplex the outputs of amplifiers 160a and 160b to capacitors 172 and 174. Switches 202 can be implemented using CMOS logic gates, bipolar junction transistors, or any other electronic device usable to control electrical current. Switches 202 implement the functionality of switch 140b in FIG. 3, but are included in rectifier blocks 200 with rectifiers 164.

Switches 202a are coupled between first stage rectifier 164a and data integrating capacitor 172. During time periods when only the first amplifier stage 160a is active, second amplifier stage 160b is not used, and MUX 110 is connecting TIA output 40 to amplifier block 130, switches 202a are closed by a controller or other logic to connect data integrating capacitor 172 to rectifier 164a and charge the data integrating capacitor to the voltage potential of first stage DC signal 136a. Switches 202b are open to prevent modifying the value stored on reference integrating capacitor 174.

Switches 202b are coupled between first stage rectifier 164a and reference integrating capacitor 174. During time periods when only the first amplifier stage 160a is active, second amplifier stage 160b is not used, and MUX 110 is connecting reference signal 122 to amplifier block 130, switches 202b are closed by a controller or other logic to connect reference integrating capacitor 174 to rectifier 164a and charge the reference integrating capacitor to the voltage potential of first stage DC signal 136a. Switches 202a are open to prevent modifying the value stored on data integrating capacitor 172.

Switches 202c are coupled between second stage rectifier 164b and data integrating capacitor 172. During time periods when both the first amplifier stage 160a and second amplifier stage 160b are being used in series, and MUX 110 is connecting TIA output 40 to amplifier block 130, switches 202c are closed by a controller to charge data integrating capacitor 172 to the voltage potential of second stage DC signal 136b from rectifier 164b. Switches 202d are open to prevent modification of the voltage potential stored in reference integrating capacitor 174.

Switches 202d are coupled between second stage rectifier 164b and reference integrating capacitor 174. During time periods when both the first amplifier stage 160a and second amplifier stage 160b are being used in series, and MUX 110 is connecting reference signal 122 to amplifier block 130, switches 202d are closed by a controller or other logic to charge reference integrating capacitor 174 to the voltage potential of second stage DC signal 136b from rectifier 164b. Switches 202c are open to preserve the voltage potential on date integrating capacitor 172.

Figure 5:
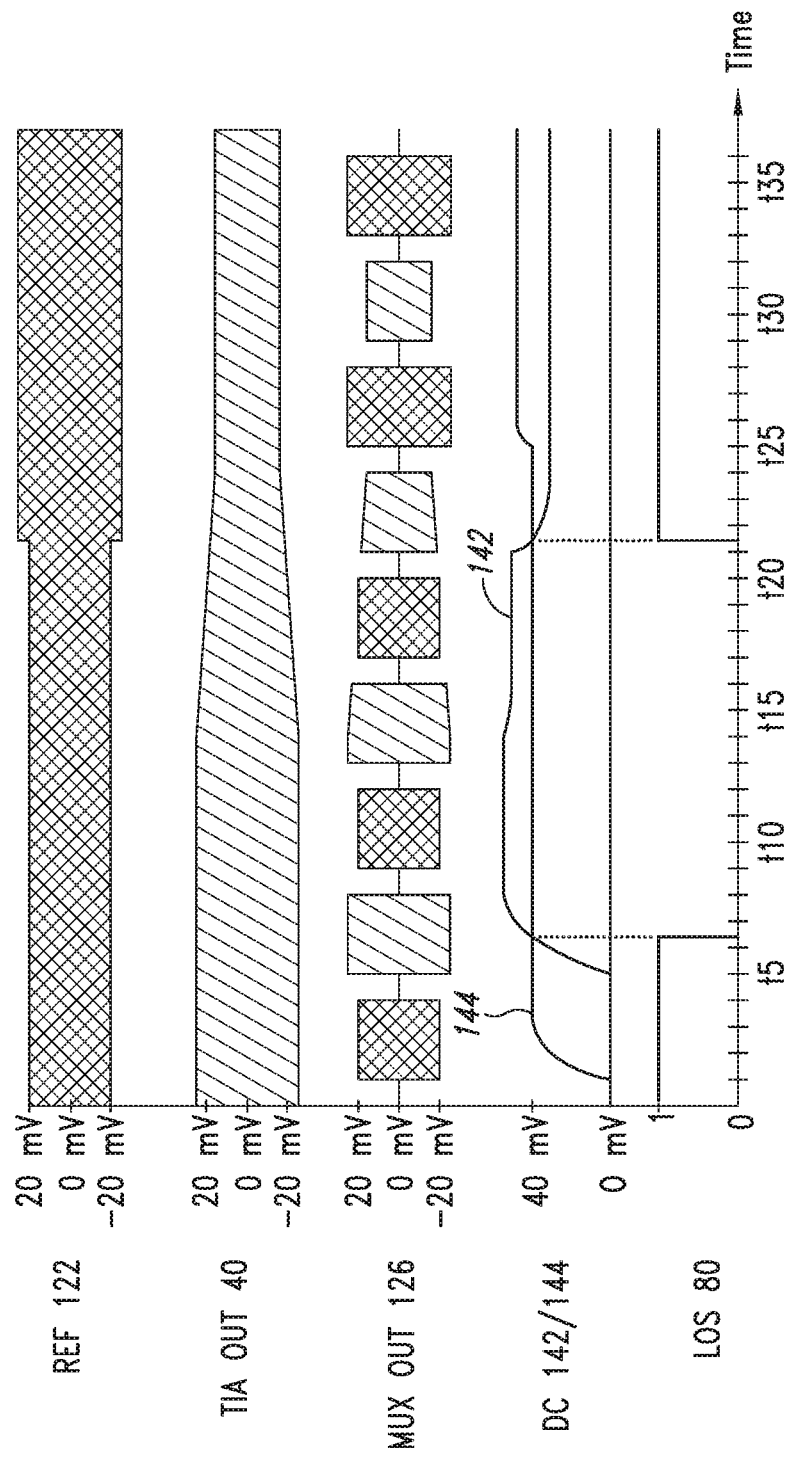
FIG. 5 illustrates timing diagrams of various signals within the multiplexed integrating amplifier.

FIG. 5 illustrates a timing diagram showing the operation of LOS circuit 100. The first plot shows reference signal 122 over time, labelled as REF 122. The threshold is set to 40 mV peak-to-peak, so the AC signal of reference signal 122 stretches from −20 mV to +20 mV at time t0. The second plot shows TIA output 40, labelled as TIA OUT 40. At time t0, TIA output 40 is at a greater magnitude than 40 mV peak-to-peak.

The third plot in FIG. 5 shows MUX output 126. MUX output 126 alternates between outputting reference signal 122 and TIA output 40. The shading of the individual plot sections of MUX output 126 indicates the source. If MUX output 126 is being generated by MUX 110 outputting reference signal 122 at a given time on the graph (for example, from time t1 to time t4), that section has square or diamond shading like the plot of reference signal 122. If MUX output 126 is outputting TIA output 40, (for example from time t5 to time t8), that section of MUX output 126 on the graph is shaded with diagonal lines like the plot of TIA output 40.

MUX 110 repeatedly alternates between outputting reference signal 122 and outputting TIA output 40. In FIG. 5, MUX 110 outputs reference signal 122 first from time t1 to t4, and then outputs TIA output 40 from time t5 to t8. MUX 110 continues alternatively outputting reference signal 122 and TIA output 40 while LOS circuit 100 is operating. The time axis is labelled in convenient units of time for explanation of the functionality of LOS circuit 100, not necessarily in a normal unit of time, e.g., µs. In one embodiment, each signal is output by MUX 110 for 6-10 µs. The time for each signal output should be long enough to properly integrate the signals on capacitors 172 and 174. The units of time are also not necessarily constant, i.e., the zeroing period between each signal output to MUX output 126 is not necessarily one quarter of the amount of time that the signal is output.

Each time MUX 110 switches which signal is being output, the output is shorted to 0 mV for a period. Auto-zero amplifier block 166 adjusts LOS amplifier 160 so that the amplifier outputs approximately 0 mV during the period of time when MUX output 126 is held at 0 mV. LOS circuit 100 zeros amplifier block 160 each time the MUX output 126 is switched so that the new signal is integrated with proper zeroing of the amplifier. The plots of FIG. 5 begin at time t0, where MUX output 126 is held at 0 mV for one unit of time. Between times t0 and t1, the input to amplifier block 130 from MUX 110 is 0 mV, and auto-zero amplifier 166 adjusts LOS amplifier 160 to output approximately 0 mV.

The fourth plot in FIG. 5 illustrates the voltage potentials of data DC signal 142 and reference DC signal 144. At time t1, when MUX 110 begins outputting reference signal 122, the voltage potential of reference DC signal 144 rises as reference integrating capacitor 174 is charged. Reference DC signal 144 rises to approximately 40 mV DC, which is the peak-to-peak voltage potential of reference signal 122. Because reference signal 122 was output first by MUX 110, the voltage on reference integrating capacitor 174 is briefly at a higher level than data integrating capacitor 172, and LOS signal 80 is asserted. LOS signal 80 is illustrated in the fifth and final plot of FIG. 5. The control logic of LOS circuit 100 can be configured to ignore spurious LOS assertions during boot-up until both integrating capacitors 172 and 174 are charged to valid voltage potentials. TIA out 40 can output from MUX 110 first during boot up, which would reduce the likelihood of LOS signal 80 being asserted during boot up. In other embodiments, glitch filter 180 is sufficient to prevent assertion of LOS signal 80 during boot up.

MUX 110 finishes outputting reference signal 122 at time t4, and outputs 0 mV for one unit of time to auto-zero LOS amplifier 160 again before switching to outputting TIA output 40 from time t5 to time t8. While TIA output 40 is output by MUX 110 between t5 and t8, data DC signal 142 rises as data integrating capacitor 172 is charged up to a voltage potential approximately equal to the peak-to-peak magnitude of TIA output 40. Data DC signal 142 increases above reference DC signal 144 shortly after time t6, and LOS signal 80 is de-asserted as a result. Meanwhile, the output of demux 140 to reference DC signal 144 is at high impedance, allowing reference integrating capacitor 174 to maintain the reference DC voltage steady while data DC signal 142 is charged.

After another period of auto-zeroing from time t8 to t9, reference signal 122 is again output to reference DC signal 144 from time t9 to time t12. Reference signal 122 has not changed, so reference DC signal 144 stays at the existing voltage potential of approximately 40 mV. Meanwhile, the output of demux 140 to data DC signal 142 is a high impedance to allow data integrating capacitor 172 to hold the data DC signal voltage potential steady.

From time t13 to time t16, MUX 110 outputs TIA output 40 again. At time t14, TIA output 40 begins lowering in magnitude due to a reduction in the optical signal magnitude received by photodiode 20. Accordingly, MUX output 126 lowers in magnitude beginning at time t14. The reduced peak-to-peak magnitude of TIA output 40 and MUX output 126 reduces the voltage potential of data DC signal 142 from t14 to t16, when MUX 110 no longer outputs TIA output 40. From time t16 to t21, while LOS circuit 100 is auto-zeroing and updating reference DC signal 144, TIA output 40 continues to shrink in magnitude. However, TIA output 40 is not forwarded on by MUX 110, so data DC signal 142 is not updated until time t21. The output of demux 140 to data DC signal 142 is high impedance and the voltage potential is held steady by data integrating capacitor 172.

By time t21, when MUX 110 outputs TIA out 40 again, the magnitude of TIA output 40 has fallen below the magnitude of reference signal 122. Data integrating capacitor 172 is discharged beginning at time t21 because of the lower voltage of data DC signal 142. Shortly after time t21, the voltage potential of data DC signal 142 falls below the voltage potential of reference DC signal 144, causing comparator 176 to assert LOS signal 80. Data DC signal 142 continues falling until time t24 when the output from demux 140 becomes a high impedance.

Shortly after time t21, when LOS signal 80 is asserted, the hysteresis feature of reference signal generator 120 kicks in and increases the peak-to-peak voltage potential of reference signal 122. At time t25, the next time MUX 110 outputs reference signal 122, the increased voltage potential is reflected to reference DC signal 144. Data DC signal 142 will need to increase to a slightly higher voltage potential than the beginning value of reference signal 122 to cause LOS signal 80 to de-assert.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a multiplexer;
   a photodiode coupled to a first input of the multiplexer;

a reference signal generator coupled to a second input of the multiplexer;
an amplifier coupled to an output of the multiplexer; and
a demultiplexer including an input of the demultiplexer coupled to an output of the amplifier.

2. The semiconductor device of claim 1, further including:
a first capacitor coupled to a first output of the demultiplexer; and
a second capacitor coupled to a second output of the demultiplexer.

3. The semiconductor device of claim 2, further including a comparator comprising a first input of the comparator coupled to the first output of the demultiplexer and a second input of the comparator coupled to the second output of the demultiplexer.

4. The semiconductor device of claim 3, further including an output of the comparator coupled to an input of the reference signal generator.

5. The semiconductor device of claim 1, further including a limiting amplifier coupled to the photodiode in parallel with the multiplexer.

6. The semiconductor device of claim 1, further including a transconductance amplifier coupled from an output of the amplifier to an input of the amplifier.

7. A semiconductor device, comprising:
a multiplexer;
a data input coupled to a first input of the multiplexer;
a reference signal generator coupled to a second input of the multiplexer; and
an amplifier coupled to an output of the multiplexer.

8. The semiconductor device of claim 7, wherein the amplifier includes a plurality of stages.

9. The semiconductor device of claim 8, further including:
a first rectifier coupled to an output of a first stage of the amplifier; and
a second rectifier coupled to an output of a second stage of the amplifier.

10. The semiconductor device of claim 7, further including a rectifier coupled to an output of the amplifier.

11. The semiconductor device of claim 10, further including a demultiplexer coupled to an output of the rectifier.

12. The semiconductor device of claim 11, further including:
a first capacitor coupled to a first output of the demultiplexer; and
a second capacitor coupled to a second output of the demultiplexer.

13. The semiconductor device of claim 12, further including a comparator coupled to the first capacitor and second capacitor.

14. A method of detecting signal loss, comprising:
receiving a data signal at a first input of a multiplexer;
receiving a reference signal at a second input of the multiplexer;
outputting the reference signal from the multiplexer to an amplifier during a first time period;
coupling an output of the amplifier to a first capacitor during the first time period;
outputting the data signal from the multiplexer to the amplifier during a second time period; and
coupling the output of the amplifier to a second capacitor during the second time period.

15. The method of claim 14, further including outputting a 0 mV signal from the multiplexer for a third time period.

16. The method of claim 15, further including modifying a bias of the amplifier during the third time period.

17. The method of claim 14, further including comparing a voltage potential of the first capacitor to a voltage potential of the second capacitor.

18. The method of claim 17, further including increasing a magnitude of the reference signal when the voltage potential of the second capacitor falls below the voltage potential of the first capacitor.

19. The method of claim 14, further including disabling a second stage of the amplifier while a first stage of the amplifier remains coupled to the first capacitor or second capacitor.

20. A method of detecting signal loss, comprising:
receiving a data signal at a first input of a multiplexer;
receiving a reference signal at a second input of the multiplexer;
outputting the reference signal from the multiplexer to an amplifier during a first time period; and
outputting the data signal from the multiplexer during a second time period.

21. The method of claim 20, further including zeroing the amplifier during a third time period.

22. The method of claim 20, further including rectifying an output of the amplifier to create a direct current (DC) signal.

23. The method of claim 22, further including:
coupling the DC signal to a first capacitor during the first time period; and
coupling the DC signal to a second capacitor during the second time period.

24. The method of claim 23, further including comparing a voltage potential of the first capacitor to a voltage potential of the second capacitor.

25. The method of claim 20, further including adjusting the reference signal based on a detected temperature.

* * * * *